(12) United States Patent
Brauer

(10) Patent No.: US 10,172,475 B2
(45) Date of Patent: Jan. 8, 2019

(54) METHOD OF DETERMINING OPTIMAL SEAT SURFACE CONTOURS AND SEAT HAVING AN OPTIMIZED SEAT SURFACE CONTOUR

(71) Applicant: B/E Aerospace, Inc., Wellington, FL (US)

(72) Inventor: Robert Klaus Brauer, Seattle, WA (US)

(73) Assignee: B/E Aerospace, Inc., Wellington, FL (US)

( * ) Notice: Subject to any disclaimer, the term of this patent is extended or adjusted under 35 U.S.C. 154(b) by 1063 days.

(21) Appl. No.: 14/242,105

(22) Filed: Apr. 1, 2014

(65) Prior Publication Data

US 2014/0292058 A1    Oct. 2, 2014

Related U.S. Application Data

(60) Provisional application No. 61/807,468, filed on Apr. 2, 2013.

(51) Int. Cl.
| | |
|---|---|
| *A47C 31/12* | (2006.01) |
| *B64D 11/06* | (2006.01) |
| *A47C 7/46* | (2006.01) |
| *G06F 17/16* | (2006.01) |
| *G06F 17/50* | (2006.01) |

(Continued)

(52) U.S. Cl.
CPC ............ *A47C 31/126* (2013.01); *A47C 7/46* (2013.01); *B60N 2/643* (2013.01); *B60N 2/646* (2013.01); *B60N 2/7017* (2013.01); *B64D 11/06* (2013.01); *G06F 17/16* (2013.01); *G06F 17/50* (2013.01); *G06F 17/5095* (2013.01); *B64D 11/0647* (2014.12); *B64D 11/0649* (2014.12); *Y02T 50/46* (2013.01)

(58) Field of Classification Search
CPC ......... A47C 31/126; A47C 7/022; A47C 7/16; A61B 5/1036; G01B 21/20; G01D 9/005
USPC ............ 73/172; 297/452.21, 452.1; 702/167, 702/155, 127
See application file for complete search history.

(56) References Cited

U.S. PATENT DOCUMENTS

| | | | | |
|---|---|---|---|---|
| 4,696,516 A | * | 9/1987 | Yeum | A47C 7/022 297/452.27 |
| 5,129,704 A | * | 7/1992 | Kishi | B60N 2/0224 297/284.1 |

(Continued)

FOREIGN PATENT DOCUMENTS

WO    WO 2014/165489 A1    10/2014

OTHER PUBLICATIONS

International Search Report prepared by the ISA/US dated Aug. 25, 2014 for International Application No. PCT/US2014/032492.

(Continued)

*Primary Examiner* — Harshad R Patel
*Assistant Examiner* — Nigel Plumb
(74) *Attorney, Agent, or Firm* — Donna P. Suchy

(57) ABSTRACT

A method of mathematically defining seat surface contours from quantitative definitions of relevant back, buttock and under-thigh surfaces of a sample of individuals, the method including adjusting a mathematical summary of the surfaces of the sample of individuals by means of a mathematical function of a summary statistic of the surfaces of the sample of individuals.

20 Claims, 6 Drawing Sheets

(51) Int. Cl.
*B60N 2/64* (2006.01)
*B60N 2/70* (2006.01)

(56) References Cited

U.S. PATENT DOCUMENTS

| | | | | |
|---|---|---|---|---|
| 5,737,845 | A | * 4/1998 | Marasus | G01B 5/0025 |
| | | | | 33/1 M |
| 2004/0011150 | A1 | * 1/2004 | Reynolds | A47C 31/126 |
| | | | | 73/866.4 |
| 2006/0150756 | A1 | * 7/2006 | Kassing | A47C 31/126 |
| | | | | 73/865.9 |
| 2007/0130750 | A1 | * 6/2007 | Milosic | A47C 7/40 |
| | | | | 29/592 |
| 2007/0228800 | A1 | * 10/2007 | Tubergen | A47C 7/28 |
| | | | | 297/452.63 |

OTHER PUBLICATIONS

Margalit Fox; Viktor Schreckengost, Master of Product Design, Dies at 101; The New York Times; Feb. 2, 2008; pp. 1-2;; http://www.nytimes.com/2008/02/02/arts/design/02schreckengost.html?mabReward=relbias . . . ; US.

Japanese Office Action dated Nov. 15, 2016 in Patent Application No. 2016-506363 (with English Translation).

* cited by examiner ized seat surface contour.

CROSS-REFERENCE TO RELATED APPLICATION

This application claims priority from U.S. Provisional Patent Application Ser. No. 61/807,468, filed Apr. 2, 2013, the contents of which are incorporated herein by reference.

TECHNICAL FIELD AND BACKGROUND OF THE INVENTION

The present invention relates to methods for deriving seat surface contours optimized to provide maximum comfort for a population of varying anthropometry, and provides a method of defining an optimum seat surface contour in the prior art of airline passenger seating as well as in residential, office and other seating. The invention also relates to a seat having an optimized seat surface contour.

Seat cushions employed in the prior art are necessarily thick to fill the substantial differences between the contours of the firm supporting surface and the passengers' bodies. The cushion thickness required to provide comfort under the prior art has several significant disadvantages. First, they occupy space that reduces the personal space available to adjacent passengers. The cushion thickness behind a passenger's buttocks and lower back reduces the legroom available to passengers seated behind the seat. Second, the cushion weight increases with cushion thickness, increasing the operating weight of the airplane resulting in reduced range, greater fuel burn and other increased costs. In addition, cushions degrade over time leaving passengers seated without substantial cushioning on the rigid supporting surface of the prior art which is sub-optimal from a comfort standpoint.

The prior art in seats with rigid supporting surfaces is also characterized by rigid supporting surfaces that do not optimally conform to the corresponding surfaces of the occupant's bodies.

BRIEF SUMMARY OF THE INVENTION

It is therefore an object of the present invention to provide a more accurate and reliable method of determining the optimal seating surface contours.

It is another object of the present invention to provide a significant improvement in the simple "mean surface" approach of the prior art in residential, commercial and other seating.

It is another object of the present invention to provide a seat having a seating surface optimized using the methods disclosed in this application.

BRIEF DESCRIPTION OF THE DRAWINGS

The present invention is best understood when the following detailed description of the invention is read with reference to the accompanying drawings, in which.

DETAILED DESCRIPTION OF THE INVENTION

Figure 1:
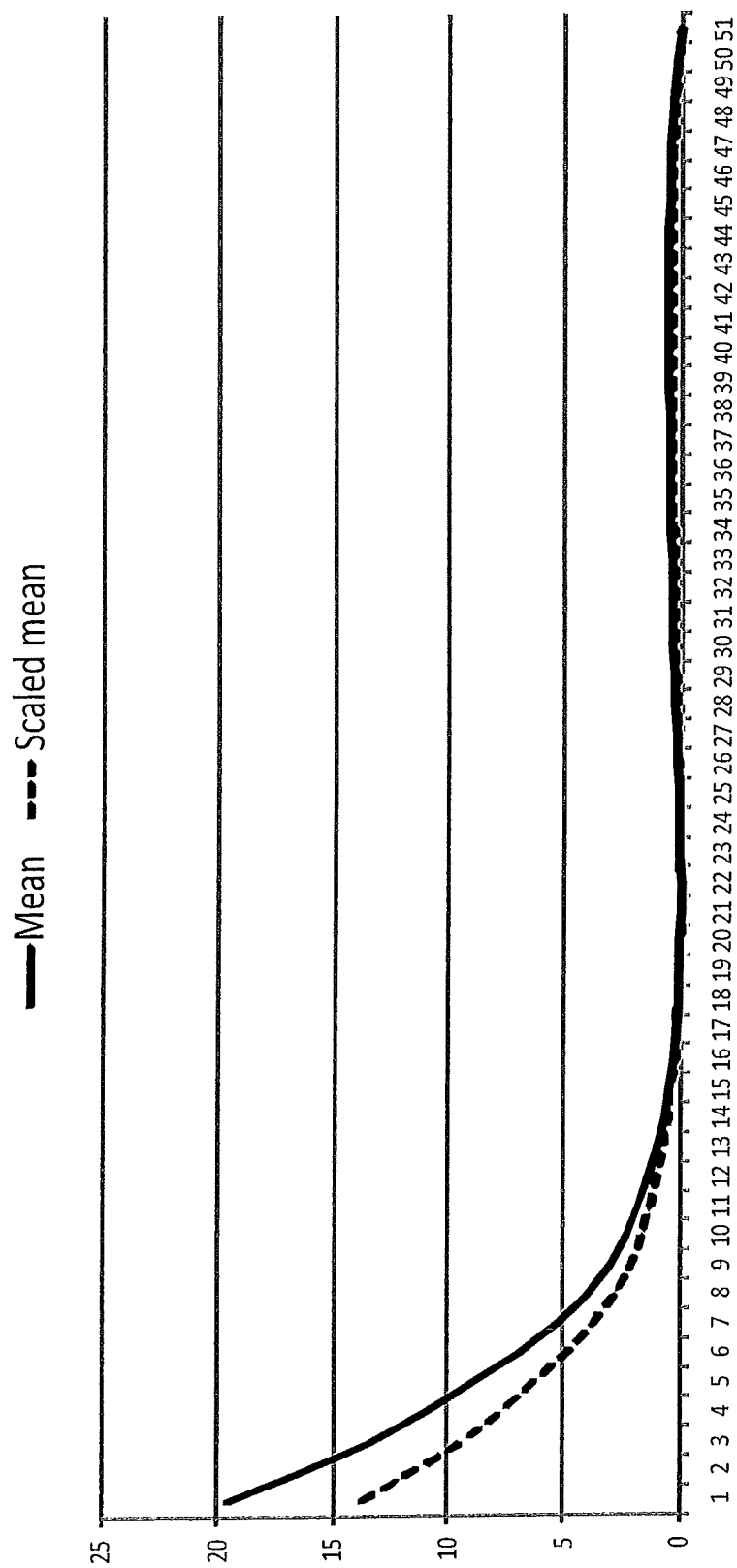
FIG. 1 is a graph showing mean and scaled mean bottom support profiles in accordance with a method of the invention.

The method described in this application blends quantitative descriptions of the back, buttock and back-of-thigh surfaces of a variety of individuals into a single surface.

Research conducted using surfaces developed using the described method of the present invention has shown that surfaces based on a simple average of the anthropometric surfaces are sub-optimal. Research conducted using surfaces developed using the method of the present invention has also shown that employing coefficients or functions in the seventh step set out below that are substantially different from the coefficients or functions employed in the fifth and sixth steps of the preferred embodiment described below results in more comfortable seat surface contours. The preferred method described provides an enabling step-by-step method to define an optimum seat surface contour.

The method of the present invention treats the seat back surface which supports the occupant's back and back of buttock as a first surface and the seat bottom surface which supports the bottom of the occupant's buttocks and thighs as a second surface. One of ordinary skill in mathematics can combine the first back surface and the second bottom surface into a single unified surface comprising the back and bottom. The present invention further includes seat surfaces defined using the method of the present invention.

Conventional three dimensional x, y, z, data are used to describe the back, back of head, back of neck, buttock and lower thigh surfaces of a sampling of target population in postures of interest. The postures of interest may include seated upright with the lower legs upright, seated upright with legs extended, reclined to various degrees with legs extended or other foreseeable postures.

The preferred method maps each first back surface with regard to an arbitrary reference plane generally parallel to the aft-most points on the occupant's back and buttocks. The x-axis runs from side to side on the occupant's body and precisely parallel to the reference plane. For convenience, zero on the x-axis can be the centerline of the back. The y-axis of the back runs generally parallel to the spine and runs precisely parallel to the reference plane. For convenience, zero on the y-axis can be the point of intersection between the reference plane for the first back surface and the reference plane for the second bottom surface. The z-axis of the back is perpendicular to the reference plane for the back surface. For convenience, zero on the z-axis for the back can lie on the reference plane and positive values lie in front of the reference plane for the first back surface.

Similarly, the preferred method maps each second bottom surface with regard to an arbitrary reference plane generally parallel to the lowest points on the occupant's buttocks and thighs. The x-axis in the preferred embodiment runs from side to side on the occupant's body and precisely parallel to the reference plane. For convenience, zero on the x-axis can be the centerline of the bottom between the legs. The y-axis of the bottom runs generally parallel to the thighs and precisely parallel to the reference plane. For convenience, zero on the y-axis can be the point of intersection between the reference plane for the first back surface and the reference plane for the second bottom surface. The z-axis of the bottom is perpendicular to the reference plane for the back surface. For convenience, zero on the z-axis lies on the reference plane and positive values lie above the reference plane for the second bottom plane.

In one preferred embodiment of the present invention, each first back and second bottom surface of interest is represented as a matrix of z values for regularly spaced locations on the x and y axes. One centimeter increments on the x and y axes have proven to provide adequate resolution while keeping the size of the database easily manageable.

In a first step of a preferred embodiment, matrices of z values are created for the first back surface and second bottom surface for each individual in a sample from the population of interest. The creation of the matrices can include laser scanning of the impressions left in soft material by seated sample subjects or any other measurement technique.

In a second step of a preferred embodiment, the mean z value for each combination of x and y in the sample is calculated and used to populate summary matrices of mean z-values for both the first back surface and second bottom surface. As an example, the z value in a matrix of mean values where x=5 and y=10 is the mean value of z where x=5 and y=10 for all individual sample subjects. The mean values can be weighted to reflect the frequency of occurrence of the anthropometry of each individual sample subject in the target population where the distribution of anthropometry in the sample does not adequately correspond to the distribution of anthropometry in the target population.

In a third step of a preferred embodiment, a second summary statistic, such as the standard deviation, of the z values for each combination of x and y in the sample is calculated and used to populate z-value second summary statistic matrices for both the first back surface and second bottom surface. As an example, the value in a second summary statistic matrix where x=5 and y=10 is the second summary statistic of z where x=5 and y=10 for all individuals in the sample. The second summary statistic can be weighted to reflect the frequency of occurrence of the anthropometry of each individual sample subject in the target population where the distribution of anthropometry in the sample does not adequately correspond to the distribution of anthropometry in the target population.

In a fourth step of a preferred embodiment of the method of the present invention, a mean spine support profile is defined by identifying the minimum z value for all values of x at each value of y in the matrix of mean z values for the first back surface created in the second step of the preferred embodiment. Similarly, a mean bottom support profile is defined by identifying the minimum z value for all values of x at each value of y in the matrix of mean z values for the second bottom surface. A mean bottom support profile is illustrated by a solid line in FIG. 1.

In a fifth step of a preferred embodiment of the method of the present invention, an adjusted spine support profile is defined by multiplying each value of z by a scaling coefficient or function. Coefficients greater than zero and less than one have proven appropriate to improving the comfort of the seat surface. As an alternative to multiplying the mean z values by a scaling coefficient or function, the adjusted spine support profile can be defined by subtracting from or adding to each z value on the mean spine support profile a function of the second summary statistic calculated in the third step of the present embodiment for the value of x at which the minimum value of z was found for the relevant value of y. As yet a further alternative, the adjusted spine support profile can be defined by both multiplying all z values by a scaling coefficient or function and adding or subtracting a function of the second summary statistic. The selection of the scaling coefficient or functions or the functions to be applied to second summary statistics can be guided by human subject testing of surfaces in which the z values of the adjusted spine support profile are employed as the z values for all values of x at the corresponding value of y.

Referring to FIG. 1, in a sixth step of a preferred embodiment of the method of the present invention, an adjusted bottom support profile is defined by multiplying each value of z by a scaling coefficient. Coefficients greater than zero and less than one have proven appropriate to improving the comfort of the seat surface. As an alternative to multiplying the mean z values by a scaling coefficient or function, the adjusted bottom support profile can be defined by subtracting from or adding to each z value on the mean bottom support profile a selected function of the second summary statistic calculated in the third step of the present embodiment for the value of x at which the minimum value of z was found for the relevant value of y. As yet a further alternative, the adjusted bottom support profile can be defined by both multiplying all z values by a scaling coefficient or function and adding a function of the second summary statistic. The selection of the scaling coefficient or functions or the functions to be applied to second summary statistics can be guided by human subject testing of surfaces in which the z values of the adjusted bottom support profile are employed as the z values for all values of x at the corresponding value of y. An adjusted bottom support profile defined by scaling all values of z by a coefficient is illustrated in FIG. 1 by a dashed line.

In a seventh step of the preferred embodiment of the method of the present invention two-dimensional, in x and z, adjusted transverse support rib profiles are defined for each value of y on the first back surface and the second bottom surface by multiplying each mean z value by a scaling coefficient or function, or as an alternative by subtracting from or adding to each z value a selected function of the second summary statistic calculated in the third step of the preferred embodiment for the same values of x and y; or as yet another alternative both multiplying each z value by a scaling coefficient or function and adding or subtracting a selected function of the second summary statistic calculated in the third step the preferred embodiment.

Figure 2:
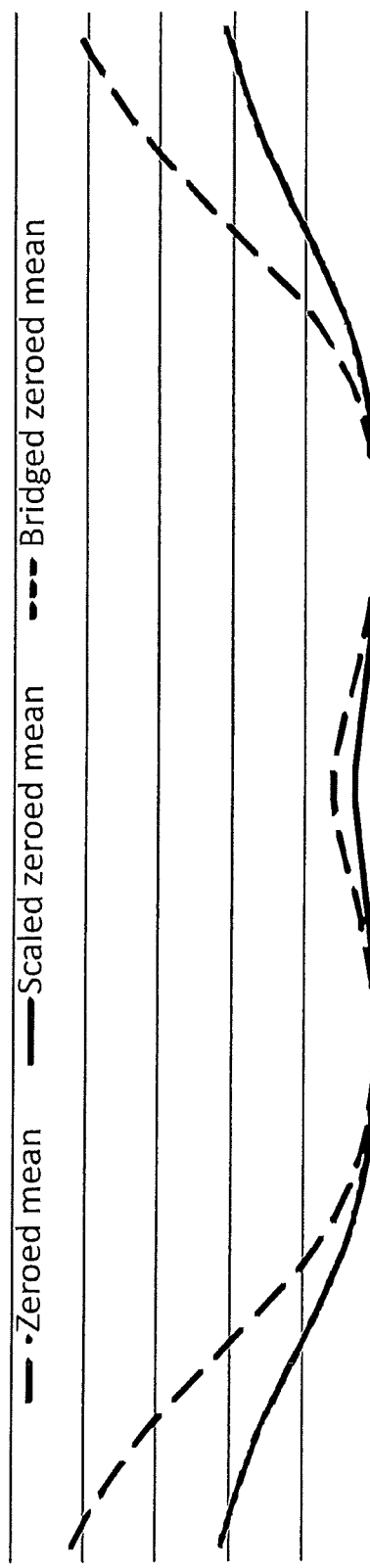
FIG. 2 is a graph showing a zeroed transverse support rib defined by scaling mean values, illustrated by a solid line in accordance with a method of the invention.

As illustrated in FIG. 2, in an eighth step of a preferred embodiment, zeroed transverse support rib profiles are defined for every value of y in the first back surface and the second bottom surface by subtracting the minimum z value identified in each adjusted transverse support rib profile defined in the seventh step of the preferred embodiment from all z values of that same adjusted transverse support rib profile. A zeroed transverse support rib defined by scaling mean values is illustrated by a solid line in FIG. 2. An unadjusted zeroed transverse support rib defined by mean z values is illustrated for comparison as a dashed line in FIG. 2.

Figure 3:
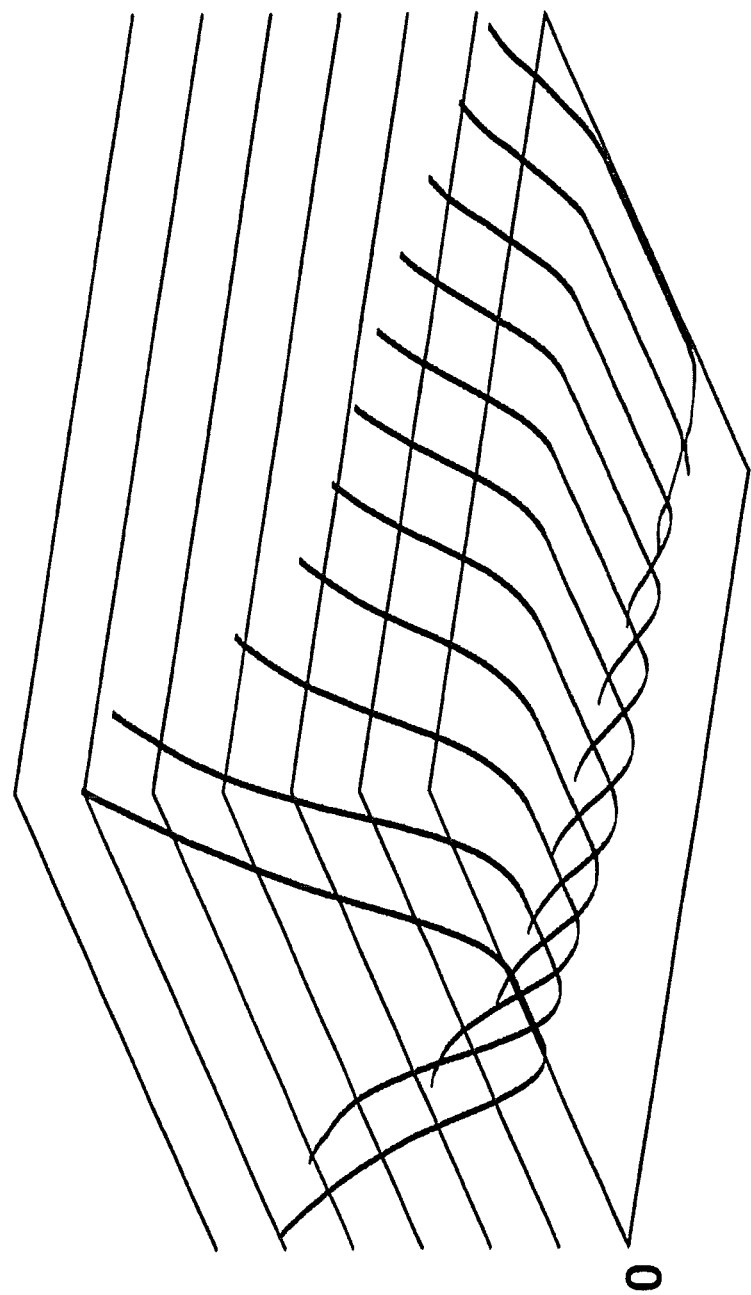
FIG. 3 is a graph showing a family of zeroed transverse support ribs spaced at 5 centimeter increments of y in accordance with a method of the invention.

As shown in FIG. 3, convex areas in the zeroed transverse support ribs that will be present between the buttocks, legs and typically along the spine between the musculature of the back can be bridged by multiplying all z values between the two lowest (zero) z values on each zeroed transverse support rib by a coefficient of less than one. Such a bridge using a coefficient of zero is illustrated by a dotted line in FIG. 2. A family of zeroed transverse support ribs spaced at 5 centimeter increments of y is illustrated in FIG. 3.

In an ninth step of a preferred embodiment of the present invention, a complete optimized first back surface contour is defined by adding the z value of the adjusted spine support profile to all z values of each zeroed transverse support rib at the corresponding value of y. Similarly, a complete optimized second bottom surface contour is defined by adding the z value of the adjusted bottom support profile to all z values of each zeroed transverse support rib at the corresponding value of y.

Figure 4:
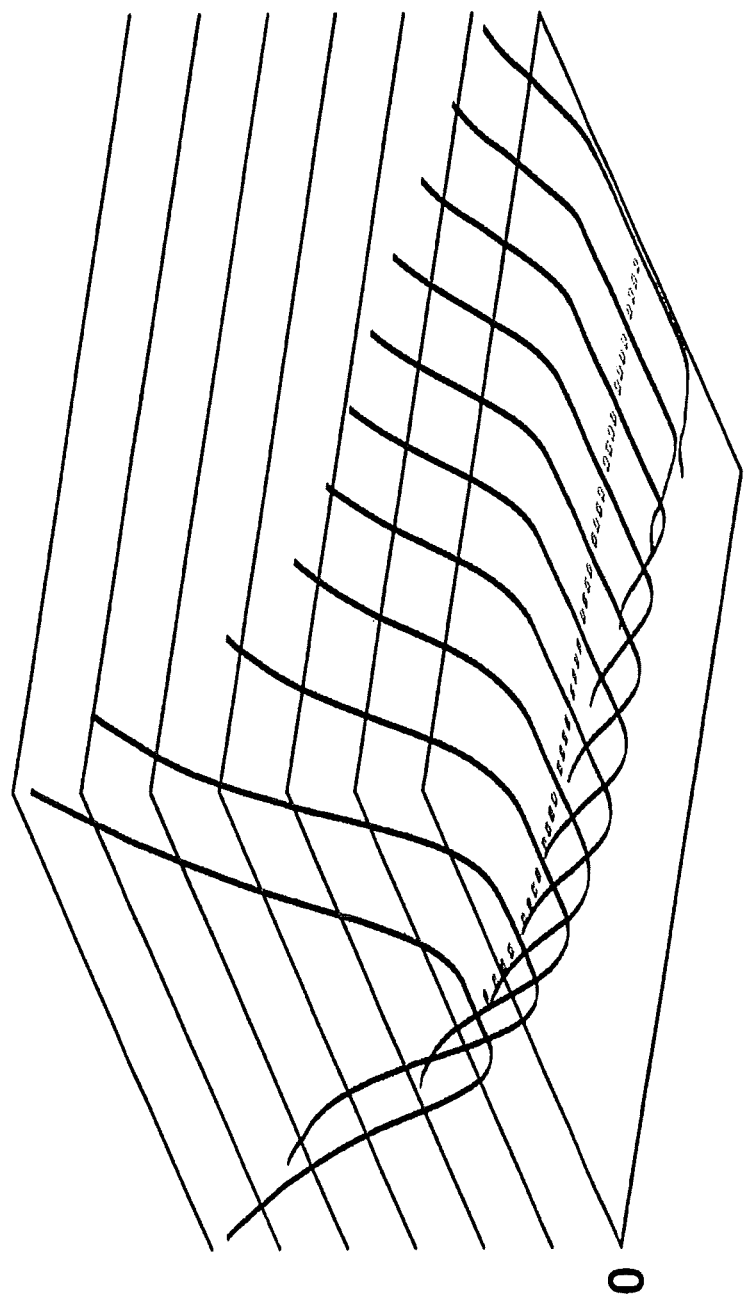
FIG. 4 is a graph showing a family of optimized bottom surface rib positions spaced at 5 centimeter increments of y in accordance with a method of the invention.

FIG. 4 illustrates the transverse support ribs of FIG. 3 displaced in the manner of defining the optimized second bottom surface contour.

Figure 5:
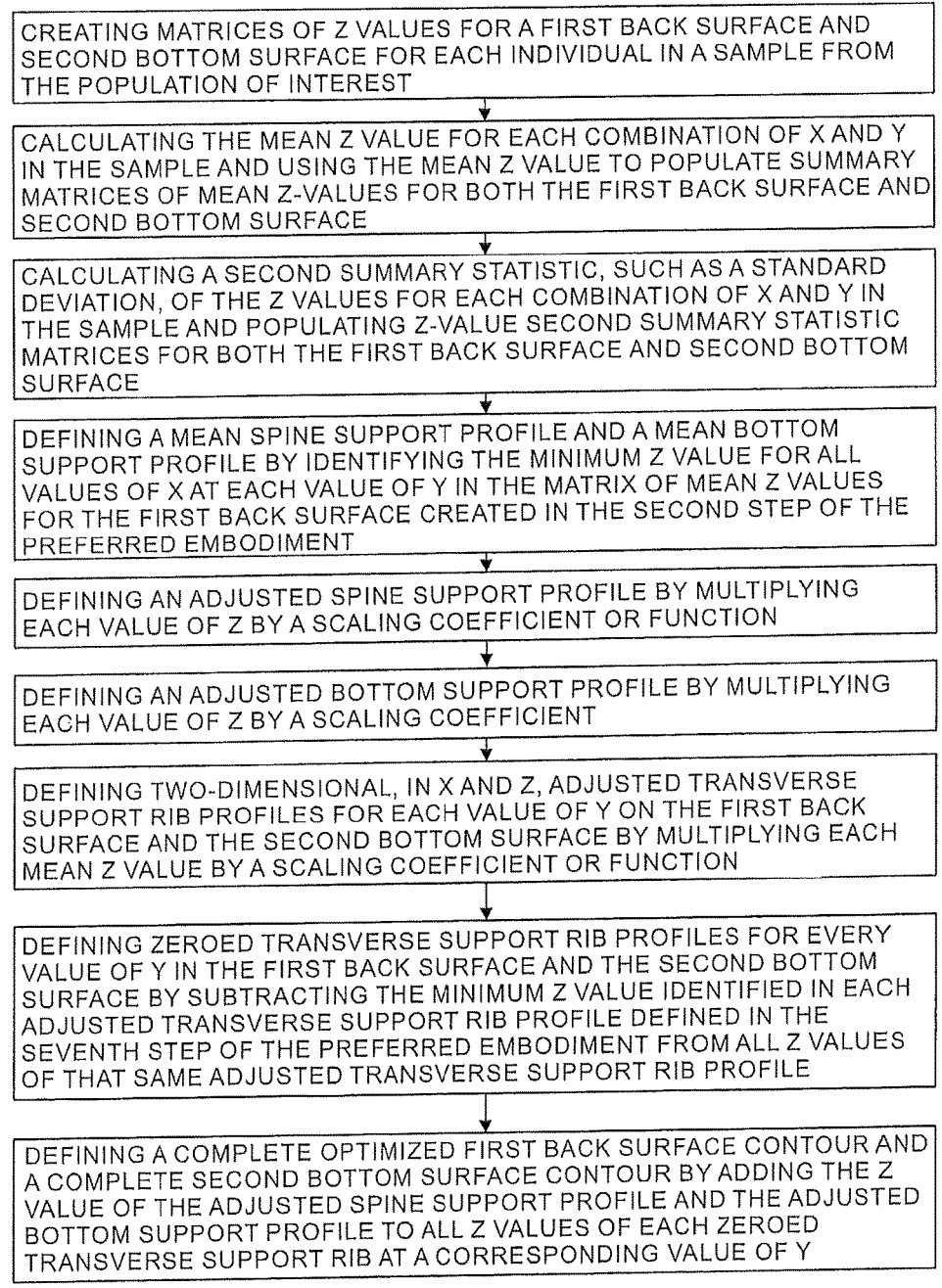
FIG. 5 is a flow chart illustrating on example of the method according to invention.

The method described above is summarized in FIG. 5.

Figure 6:
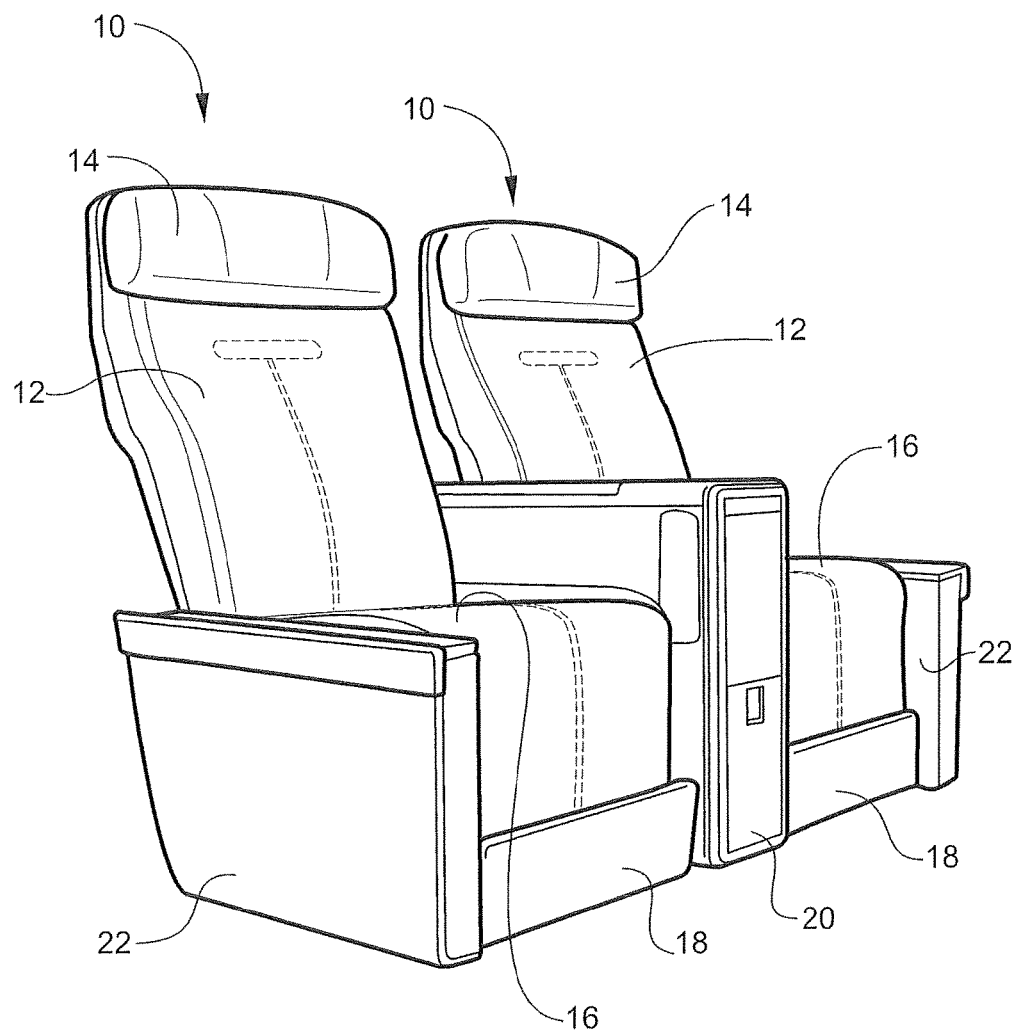
FIG. 6 is a seat having an optimized bottom surface seating area according to the method of the invention.

Referring now to FIG. 6, seats 10, as illustrated, are of a type with which the method is useful in optimizing the seat bottom contour. The seats 10 each include a seat back 12, a headrest 14, a seat bottom 16 and an extendable legrest 18. The seats 10 are separated by a center console 20 and are each provided with an end bay 22. The method is also useful on any type of aircraft passenger seat, including commuter, short haul and long haul aircraft seating products, as well as other types of transportation seating and office seating products.

A method of determining optimal seat surface contours and seats optimized according to the method according to the invention have been described with reference to specific embodiments and examples. Various details of the invention may be changed without departing from the scope of the invention. Furthermore, the foregoing description of the preferred embodiments of the invention and best mode for practicing the invention are provided for the purpose of illustration only and not for the purpose of limitation, the invention being defined by the claims.

What is claimed is:

1. An aircraft passenger seat having a plurality of seat surfaces configured for a target population of varying anthropometry, the aircraft passenger seat comprising:
  a seat back produced with contours derived from
    i) obtaining first quantitative definitions of back surfaces of a sample of individuals relative to a seat back surface reference,
    ii) adjusting a first mathematical summary of the quantitative definitions of the back surfaces of the sample of individuals by
      a) a fore-aft mathematical function of a summary statistic of the of back surfaces of the sample of individuals on a fore and aft axis of the seat back surface reference, and
      b) a side-side mathematical function of a summary statistic of the back surfaces of the sample of individuals on a side-to-side axis of the seat back surface reference; and
  a seat bottom produced with contours derived from
    iii) obtaining second quantitative definitions of buttock and under thigh surfaces of the sample of individuals relative to a seat bottom surface reference, and
    iv) adjusting a second mathematical summary of the quantitative definitions of the buttock and under thigh surfaces of the sample of individuals by a mathematical function of a summary statistic of the buttock and under thigh surfaces of the sample of individuals.

2. The aircraft passenger seat according to claim 1, wherein adjusting the second mathematical summary of the quantitative definitions of the buttock and under thigh surfaces of the sample of individuals comprises adjusting the second mathematical summary of the quantitative definitions of the buttock and under thigh surfaces of the sample of individuals by:
  a) a second fore-aft mathematical function of a summary statistic of the buttock and under thigh surfaces of the sample of individuals on a fore and aft axis of the seat bottom surface reference; and
  b) a second side-side mathematical function of a summary statistic of the buttock and under thigh surfaces of the sample of individuals on a side-to-side axis of the seat bottom surface reference.

3. The aircraft passenger seat according to claim 1, wherein obtaining first quantitative definitions of back surfaces comprises obtaining first quantitative definitions of back, back of head, back of neck and back of buttock surfaces of the sample of individuals.

4. The aircraft passenger seat according to claim 1, wherein the seat back surface reference is defined using an x-axis as a centerline of a back of a reference seat and a y-axis parallel to a spine angle of the reference seat parallel to a pre-defined reference plane.

5. A method of producing an aircraft passenger seat by a process comprising:
  determining quantitative definitions of back, buttock and under-thigh surfaces of a sample of individuals;
  determining an improved bottom surface contour by adjusting a mathematical summary of the buttock and under-thigh surfaces of the sample of individuals by
    i) applying a first mathematical function of a summary statistic of the buttock and under-thigh surfaces of the sample of individuals on a fore and aft axis of a seat bottom surface reference, and
    ii) applying a second, different mathematical function of a summary statistic of the buttock and under-thigh surfaces of the sample of individuals on a side-to-side axis of the seat bottom surface reference;
  determining an improved back surface contour by adjusting a mathematical summary of the back surfaces of the sample of individuals by applying a third mathematical function of a summary statistic of the back surfaces of the sample of individuals;
  conforming a seat bottom of the aircraft passenger seat to the improved bottom surface contour; and
  conforming a seat back of the aircraft passenger seat to the improved back surface contour.

6. The method of claim 5, wherein determining the improved back surface contour comprises applying the third mathematical function of a summary statistic of the back surfaces of the sample of individuals on a fore and aft axis of a seat back surface reference, and a fourth, different mathematical function of a summary statistic of the back surfaces of the sample of individuals on a side-to-side axis of the seat back surface reference.

7. The method of claim 6, wherein the third mathematical function comprises defining a mean spine support profile by identifying the minimum z-value for all values of x at each value of y in a matrix of mean z values for the back surface reference.

8. The method of claim 7, wherein the fourth mathematical function comprises defining a two-dimensional, in x and z, adjusted back transverse support rib profiles for each value of y on the back surface reference by multiplying each mean z-value by a scaling coefficient or function.

9. The method of claim 8, wherein determining the improved back surface contour further comprises:
  defining zeroed back transverse support rib profiles for every value of y in the back surface by subtracting the minimum z value identified in each adjusted back transverse support rib profile from all z-values of that same adjusted transverse support rib profile; and
  adding the z-value of the mean spine support profile to all z-values of each zeroed back transverse support rib at the corresponding value of y.

10. The method of claim 5, further comprising obtaining a plurality of measurements from impressions in soft material of a test seat by the sample of individuals, wherein determining the quantitative definitions of back, buttock and under-thigh surfaces of the sample of individuals comprises creating matrices of z-values from the plurality of measurements.

11. The method of claim 5, wherein the first mathematical function comprises defining a mean bottom support profile by identifying the minimum z-value for all values of x at each value of y in a matrix of mean z values for the bottom surface reference.

12. The method of claim 11, further comprising determining an adjusted bottom support profile by subtracting from or adding to each z-value of the mean bottom support profile a function of a summary statistic for the value of x at which the minimum value of z was found for the relevant value of y.

13. The method of claim 11, wherein the mean z-values are weighted to reflect the frequency of occurrence of the anthropometry of each individual sample subject in the target population where the distribution of anthropometry in the sample does not adequately correspond to the distribution of anthropometry in the target population.

14. The method of claim 5, wherein the second mathematical function comprises defining a two-dimensional, in x and z, adjusted bottom transverse profile for each value of y on the bottom surface reference.

15. The method of claim 5, wherein the seat back surface reference is defined using an x-axis as a centerline of a back of a reference seat and a y-axis parallel to a spine angle of the reference seat parallel to a pre-defined reference plane.

16. The method of claim 15, wherein the seat bottom surface reference is defined using an x-axis as a side-to-side plane parallel to the pre-defined reference plane and a z-axis perpendicular to the pre-defined reference plane.

17. A method of producing an aircraft passenger seat by a process comprising:
  determining quantitative definitions of back, buttock and under-thigh surfaces of a sample of individuals;
  determining an improved bottom surface contour by adjusting a mathematical summary of buttock and bottom thigh surfaces of a sample of individuals by applying a first mathematical function of a summary statistic of the buttock and bottom thigh surfaces of the sample of individuals;
  determining an improved back surface contour by
    applying a second mathematical function of a summary statistic of the back surfaces of the sample of individuals on a fore and aft axis of a seat back surface reference, and
    applying a third, different mathematical function of a summary statistic of the back surfaces of the sample of individuals on a side-to-side axis of the seat back surface reference;
  conforming a seat bottom of the aircraft passenger seat to the improved bottom surface contour; and
  conforming a seat back of the aircraft passenger seat to the improved back surface contour.

18. The method of claim 17, wherein:
  the first mathematical function is applied on a fore and aft axis of a seat bottom surface reference; and
  determining the improved bottom surface contour further comprises applying a second, different mathematical function of a summary statistic of the buttock and under-thigh surfaces of the sample of individuals on a side-to-side axis of the seat bottom surface reference.

19. The method of claim 17, wherein determining the quantitative definitions further comprises determining quantitative definitions from back of head, back of neck and back of buttock surfaces of the sample of individuals.

20. The method of claim 17, wherein determining the quantitative definitions further comprises weighting the quantitative definitions, for each individual of the sample of individuals, to reflect a frequency of occurrence of anthropometry of the respective individual in the target population.

* * * * *